US009466352B2

(12) United States Patent
Perner

(10) Patent No.: US 9,466,352 B2
(45) **Date of Patent: *Oct. 11, 2016**

(54) DYNAMIC/STATIC RANDOM ACCESS MEMORY (D/SRAM)

(75) Inventor: Frederick A. Perner, Santa Barbara, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 266 days.

This patent is subject to a terminal disclaimer.

(21) Appl. No.: 14/374,789

(22) PCT Filed: Jan. 30, 2012

(86) PCT No.: PCT/US2012/023197

§ 371 (c)(1),
(2), (4) Date: Jul. 25, 2014

(87) PCT Pub. No.: WO2013/115778

PCT Pub. Date: Aug. 8, 2013

(65) Prior Publication Data

US 2014/0379977 A1 Dec. 25, 2014

(51) Int. Cl.

*G11C 11/406* (2006.01)
*G11C 11/407* (2006.01)
*G11C 11/412* (2006.01)
*G11C 19/00* (2006.01)
*G11C 11/417* (2006.01)
*G11C 19/28* (2006.01)

(52) U.S. Cl.

CPC ............ *G11C 11/407* (2013.01); *G11C 11/412* (2013.01); *G11C 11/417* (2013.01); *G11C 19/00* (2013.01); *G11C 19/28* (2013.01)

(58) Field of Classification Search

None
See application file for complete search history.

(56) References Cited

U.S. PATENT DOCUMENTS 3,766,534 A * 10/1973 Beausoleil ........... G11C 19/287 711/109
4,813,015 A * 3/1989 Spak ...................... G11C 19/00 365/240
4,864,544 A 9/1989 Spak et al.

(Continued)

FOREIGN PATENT DOCUMENTS

JP 2009-099165 A 5/2009
JP 2010-238284 A 10/2010

OTHER PUBLICATIONS

PCT Search Report/Written Opinion—Application No. PCT/US2012/023197 dated Oct. 23, 2012—9 pages.

*Primary Examiner* — Prasith Thammavong
*Assistant Examiner* — Jason Blust
(74) *Attorney, Agent, or Firm* — North Shore Associates

(57) ABSTRACT

Dynamic/static random access memory (D/SRAM) cell, block shift static random access memory (BS-SRAM) and method using the same employ dynamic storage mode and dynamic storage mode switching to shift data. The D/SRAM cell includes a static random access memory (SRAM) cell having a pair of cross-coupled elements to store data, and a dynamic/static (D/S) mode selector to selectably switch the D/SRAM cell between the dynamic storage mode and a static storage mode. The BS-SRAM includes a plurality of D/SRAM cells arranged in an array and a controller to shift data from an adjacent D/SRAM cell in a second row of the array to a D/SRAM cell in a first row. The method includes switching the mode of, coupling data from an adjacent memory cell to, and storing the coupled data in, a selected D/SRAM cell.

13 Claims, 6 Drawing Sheets

(56) References Cited

U.S. PATENT DOCUMENTS 5,631,863 A * 5/1997 Fechner .............. G11C 11/4125
365/190
6,141,739 A 10/2000 Provence et al.
6,157,990 A 12/2000 Randolph et al.
6,222,757 B1 4/2001 Rau et al.
6,327,175 B1 12/2001 Manapat et al.
6,765,832 B1 7/2004 Ohtani
7,474,574 B1 1/2009 Agarwal et al.
7,616,519 B2 11/2009 Komatsu et al.
7,962,821 B2 6/2011 Tokunaga et al.
2001/0040827 A1 11/2001 Dosaka et al.
2002/0006071 A1 1/2002 Ikeda et al.
2006/0274585 A1 12/2006 Jung
2009/0010043 A1 1/2009 Gonzalez et al.
2011/0085390 A1 4/2011 Arsovski et al.

* cited by examiner

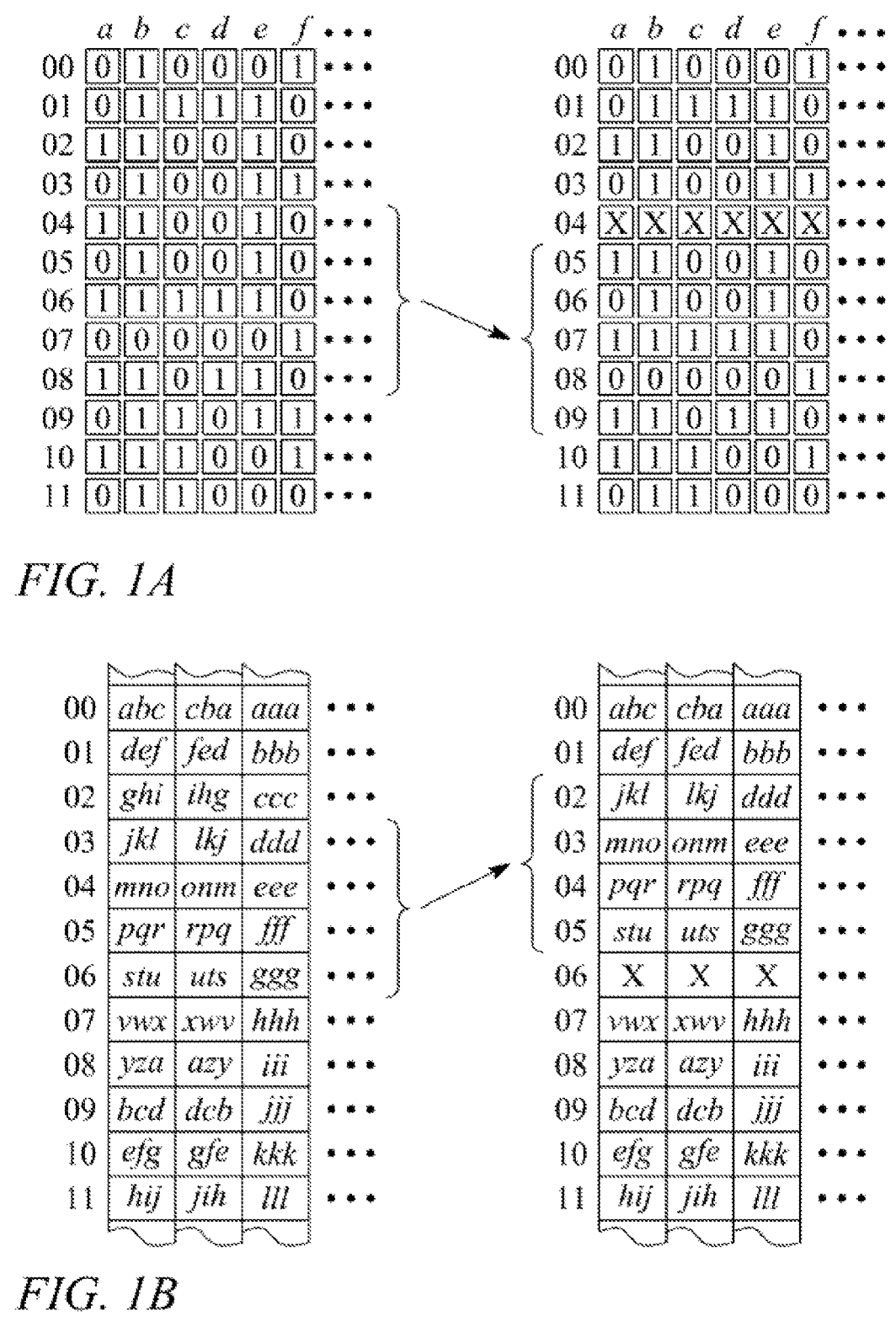

| | a | b | c | d | e | f | ••• |
|---|---|---|---|---|---|---|---|
| 00 | 0 | 1 | 0 | 0 | 0 | 1 | ••• |
| 01 | 0 | 1 | 1 | 1 | 1 | 0 | ••• |
| 02 | 1 | 1 | 0 | 0 | 1 | 0 | ••• |
| 03 | 0 | 1 | 0 | 0 | 1 | 1 | ••• |
| 04 | 1 | 1 | 0 | 0 | 1 | 0 | ••• |
| 05 | 0 | 1 | 0 | 0 | 1 | 0 | ••• |
| 06 | 1 | 1 | 1 | 1 | 1 | 0 | ••• |
| 07 | 0 | 0 | 0 | 0 | 0 | 1 | ••• |
| 08 | 1 | 1 | 0 | 1 | 1 | 0 | ••• |
| 09 | 0 | 1 | 1 | 0 | 1 | 1 | ••• |
| 10 | 1 | 1 | 1 | 0 | 0 | 1 | ••• |
| 11 | 0 | 1 | 1 | 0 | 0 | 0 | ••• |

| | a | b | c | d | e | f | ••• |
|---|---|---|---|---|---|---|---|
| 00 | 0 | 1 | 0 | 0 | 0 | 1 | ••• |
| 01 | 0 | 1 | 1 | 1 | 1 | 0 | ••• |
| 02 | 1 | 1 | 0 | 0 | 1 | 0 | ••• |
| 03 | 0 | 1 | 0 | 0 | 1 | 1 | ••• |
| 04 | X | X | X | X | X | X | ••• |
| 05 | 1 | 1 | 0 | 0 | 1 | 0 | ••• |
| 06 | 0 | 1 | 0 | 0 | 1 | 0 | ••• |
| 07 | 1 | 1 | 1 | 1 | 1 | 0 | ••• |
| 08 | 0 | 0 | 0 | 0 | 0 | 1 | ••• |
| 09 | 1 | 1 | 0 | 1 | 1 | 0 | ••• |
| 10 | 1 | 1 | 1 | 0 | 0 | 1 | ••• |
| 11 | 0 | 1 | 1 | 0 | 0 | 0 | ••• |

*FIG. 1A*

| | | | | |
|---|---|---|---|---|
| 00 | abc | cba | aaa | ••• |
| 01 | def | fed | bbb | ••• |
| 02 | ghi | ihg | ccc | ••• |
| 03 | jkl | lkj | ddd | ••• |
| 04 | mno | onm | eee | ••• |
| 05 | pqr | rpq | fff | ••• |
| 06 | stu | uts | ggg | ••• |
| 07 | vwx | xwv | hhh | ••• |
| 08 | yza | azy | iii | ••• |
| 09 | bcd | dcb | jjj | ••• |
| 10 | efg | gfe | kkk | ••• |
| 11 | hij | jih | lll | ••• |

| | | | | |
|---|---|---|---|---|
| 00 | abc | cba | aaa | ••• |
| 01 | def | fed | bbb | ••• |
| 02 | jkl | lkj | ddd | ••• |
| 03 | mno | onm | eee | ••• |
| 04 | pqr | rpq | fff | ••• |
| 05 | stu | uts | ggg | ••• |
| 06 | X | X | X | ••• |
| 07 | vwx | xwv | hhh | ••• |
| 08 | yza | azy | iii | ••• |
| 09 | bcd | dcb | jjj | ••• |
| 10 | efg | gfe | kkk | ••• |
| 11 | hij | jih | lll | ••• |

*FIG. 1B*

| | |
|---|---|
| LEN | 0 0 0 0 0 0 0 0 0 0 0 0 0 0 0 0 1 1 1 1 1 1 1 1 1 1 1 1 1 1 1 1 |
| | 0 0 0 0 0 0 0 0 1 1 1 1 1 1 1 1 0 0 0 0 0 0 0 0 1 1 1 1 1 1 1 1 |
| ADDR | 0 0 0 0 1 1 1 1 0 0 0 0 1 1 1 1 0 0 0 0 1 1 1 1 0 0 0 0 1 1 1 1 |
| | 0 0 1 1 0 0 1 1 0 0 1 1 0 0 1 1 0 0 1 1 0 0 1 1 0 0 1 1 0 0 1 1 |
| | 0 1 0 1 0 1 0 1 0 1 0 1 0 1 0 1 0 1 0 1 0 1 0 1 0 1 0 1 0 1 0 1 |
| $R_0$ | 1 0 0 0 0 0 0 0 1 0 0 0 0 0 0 0 1 0 0 0 0 0 0 0 1 0 0 0 0 0 0 0 |
| $R_1$ | 0 1 0 0 0 0 0 0 1 1 0 0 0 0 0 0 1 1 0 0 0 0 0 0 1 1 0 0 0 0 0 0 |
| $R_2$ | 0 0 1 0 0 0 0 0 0 1 1 0 0 0 0 0 1 1 1 0 0 0 0 0 1 1 1 0 0 0 0 0 |
| $R_3$ | 0 0 0 1 0 0 0 0 0 0 1 1 0 0 0 0 0 1 1 1 0 0 0 0 1 1 1 1 0 0 0 0 |
| $R_4$ | 0 0 0 0 1 0 0 0 0 0 0 1 1 0 0 0 0 0 1 1 1 0 0 0 0 1 1 1 1 0 0 0 |
| $R_5$ | 0 0 0 0 0 1 0 0 0 0 0 0 1 1 0 0 0 0 0 1 1 1 0 0 0 0 1 1 1 1 0 0 |
| $R_6$ | 0 0 0 0 0 0 1 0 0 0 0 0 0 1 1 0 0 0 0 0 1 1 1 0 0 0 0 1 1 1 1 0 |
| $R_7$ | 0 0 0 0 0 0 0 1 0 0 0 0 0 0 1 1 0 0 0 0 0 1 1 1 0 0 0 0 1 1 1 1 |

DYNAMIC/STATIC RANDOM ACCESS MEMORY (D/SRAM)

CROSS-REFERENCE TO RELATED APPLICATIONS

N/A

STATEMENT REGARDING FEDERALLY SPONSORED RESEARCH OR DEVELOPMENT

N/A

BACKGROUND

Modern computers and related processing systems typically include a processor and some form of memory. The processor is generally responsible for performing the various computational tasks of the computer while the memory stores data that is used in and generated by the computational tasks. The architectural division of processing by the processor and data storage by the memory has proven successful for nearly the entire history of such systems.

For example, a typical general-purpose computer usually includes a central processing (CPU) and a main memory that communicate with one another over one or more communication channels (e.g., data, command and address buses). Typically, the CPU provides facilities to perform various arithmetic and logical operations, to provide operational sequencing, and to otherwise control aspects of the general-purpose computer. For example, virtually all CPUs provide functions or operations for reading data from memory, writing data to memory, and executing programs comprising a set of instructions that utilizes the data to perform a predefined task. In addition, CPUs may handle input/output (I/O) allowing communication with peripherals as well as subsystems outside of the general-purpose computer. CPUs may even provide graphics processing to handle generating and updating a graphical display (e.g., a monitor), in some examples.

In contrast, the main memory of modern computers, which can include one or more of static random access memory (SRAM), dynamic random access memory (DRAM), read-only memory (ROM), programmable ROM (PROM), flash memory and a variety of other memory types, typically provides a relatively narrow set of capabilities. Principal among these capabilities is storing computer programs and data that are executed and used by the CPU. Among other limited capabilities that may be found in, or that are often associated with, the main memory of modern computers are certain memory management functions. For example, DRAM memory subsystems of main memory may possess circuitry for automatic refresh of data stored therein.

BRIEF DESCRIPTION OF THE DRAWINGS

Various features of examples in accordance with the principles described herein may be more readily understood with reference to the following detailed description taken in conjunction with the accompanying drawings, where like reference numerals designate like structural elements, and in which:

FIG. 1A illustrates an example of a downshift of a contiguous subset of data stored in a 2-D array within a block shift shiftable memory, according to an example consistent with of the principles described herein.

FIG. 1B illustrates an example of an upshift of a contiguous subset of data stored in a 2-D array within a block shift shiftable memory, according to an example consistent with the principles described herein.

Figure 2:
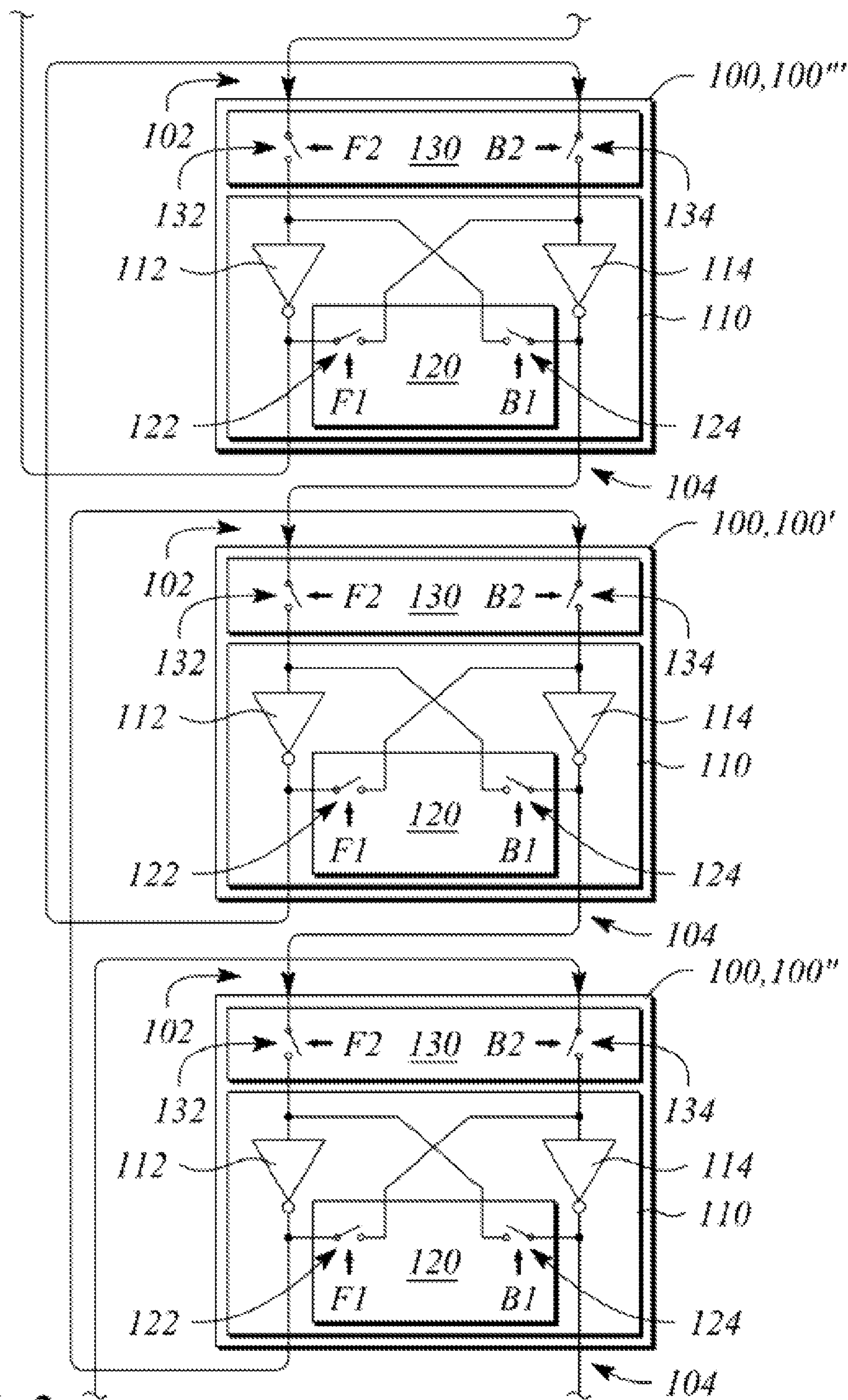
FIG. 2 illustrates a block diagram of a dynamic/static random access memory (D/SRAM) cell, according to an example consistent with the principles described herein.

Certain examples have other features that are one of in addition to and in lieu of the features illustrated in the above-referenced figures. These and other features are detailed below with reference to the above-referenced figures.

DETAILED DESCRIPTION

Examples in accordance with the principles described herein provide a shiftable memory with built-in shifting capability. In particular, a contiguous subset of data stored in a selected row or a 'block' of rows of the shiftable memory is shifted by the shiftable memory described herein to implement the built-in shifting capability. As such, the shiftable memory described herein may be referred to as a 'block shift' shiftable memory. Further, the block shift shiftable memory employs static random access memory (SRAM) and thus may be referred to as block shift SRAM (BS-SRAM), according to various examples. The built-in data shifting capability of BS-SRAM provides a translation of the contiguous subset of data from the selected row(s) to another row(s). The translation may be one or both of an upshift and a downshift of the stored data, according to various examples. Moreover, a direction of the shift (i.e., up or down) as well as an amount or distance of the shift may be selectable, in some examples. Examples in accordance with the principles described herein have application in computer systems and related data processing systems. In particular, the examples described herein provide block shift shiftable memory with built-in shifting capability that is useful for a wide variety of data processing systems and data processing tasks performed by such systems.

According to various examples, the contiguous subset of stored data (e.g., data words) may be shifted within the memory from a first memory location to a second memory location within the block shift shiftable memory. The shifted data retain an ordered relationship within the contiguous subset when shifted to the second location, according to some examples. Moreover, the shift takes place entirely within the block shift shiftable memory (e.g., within a memory chip or chip set that implements BS-SRAM) and the shift is generally accomplished without using resources, such as a processor, that are outside of the block shift shiftable memory. In particular, the shift is accomplished using shift logic that comprises circuitry (e.g., a shift circuit) of memory cells that make up the block shift shiftable memory, according to various examples. Further, the shift does not involve data being moved between a processor and the memory, according to various examples.

In some examples, the shift provided by the block shift shiftable memory may be employed to 'open' a location in memory into which new data may be inserted. In particular, a memory location either above or below the contiguous subset of stored data may be rendered available for data insertion when the contiguous subset of stored data is moved by the shift within the block shift shiftable memory. In some examples, the contiguous subset comprises data of a plurality of rows (e.g., a 'block'). In these examples, the memory location opened by the shift may be a row at the beginning or 'insert' end of the plurality or block of rows. In other examples, the contiguous subset comprises data of a single row. In these examples, the location opened by the shift is the selected row.

According to some examples, the shift may be used to delete or 'overwrite' data stored at a terminal or 'delete' end of the contiguous subset. In particular, the data stored in a row that is either above or below a block of rows containing the contiguous subset may be overwritten with data in a row of the contiguous subset itself, when the contiguous subset of data is shifted by the block shift shiftable memory. In other examples, when the contiguous subset of data is located at a physical end or boundary of the block shift shiftable memory, shifting the contiguous subset may substantially shift a portion (i.e., a row) of the data off the physical end of (or substantially out of) the block shift shiftable memory. Depending on a direction of the shift, the data of the row may be shifted off of either the top end or the bottom end, for example. Data shifted off the physical end of the row may be substantially 'lost' or removed from the shiftable memory and thus be considered deleted, according to some examples. Moreover, when the data are deleted by being shifted off the physical end of the block shift shiftable memory, data deletion may occur without overwriting the data, in some examples.

According to some examples, shifting data to either insert data or delete data in the block shift shiftable memory may be accomplished in less time, and in some examples in considerably less time, than is generally possible without using block shift shiftable memory. In fact, the shift may be accomplished in substantially constant time (e.g., a fixed number of clock cycles) using block shift shiftable memory, according to some examples. For example, the shift may be accomplished in one clock cycle of the block shift shiftable memory.

In contrast, conventional memory that relies on a processor, for example, to perform a shift generally requires an amount of time that is proportional to an amount of data being shifted. For example, shifting data in conventional memory typically involves the processor reading the data to be shifted and then writing the data back to memory in another location. Reading and writing may be performed by the processor on a word-by-word basis due to the structure and functionality of conventional memory, for example. Since each piece of data (e.g., a data word) in the data being shifted is first read from the conventional memory by the processor and then subsequently written back to the conventional memory, the time to shift the data is generally proportional to the amount or length of the data (e.g., number of data words) being shifted, for example. The larger the amount of data, the longer the shift operation will take.

Moreover, conventional memory relies on a resource (e.g., the processor) that is external to the conventional memory to perform the reading and writing when shifting the data. Since the resource performing the shift is external to the conventional memory, each of the data words involved in the word-by-word shift must pass between the external resource and the conventional memory through some form of data bus or similar communication channel. The data bus or similar communication channel may substantially limit a speed of the read and write operations and as a result, an overall speed of the shift. Hence, shifting large subsets of data can become prohibitively expensive in terms of the processing time due to one or both of the effects of data bus speed and the proportional time aspects of performing a shift using conventional memory.

In accordance with the principles described herein, block shift shiftable memory has built-in shifting capability so that data are not read and then written by an external resource to perform a shift, for example. The contiguous subset of stored data is identified to the block shift shiftable memory (e.g., using an address and a length) and the block shift shiftable memory is instructed to shift the contiguous subset. The shift is then accomplished by and takes place entirely within the block shift shiftable memory. Speed limitations associated with transferring data to and from an external resource are substantially eliminated by block shift shiftable memory, according to examples of the principles described herein. Moreover, time for shifting may be substantially independent of the length of the contiguous subset, for example.

In particular, shifting within the block shift shiftable memory may be implemented with circuitry of the block shift shiftable memory itself, according to the principles described herein. As such, shifting using block shift shiftable memory does not require sequentially reading and writing each data word of the contiguous subset. For example, shifting using block shift shiftable memory may shift all of the data in the contiguous subset in a substantially simultaneous manner. As such, the block shift shiftable memory may implement shifting of the contiguous subset in a time that is substantially independent of the length of the contiguous subset.

As mentioned above, in some examples, the block shift shiftable memory may perform the shift in substantially constant time, according to examples of the principles described. By 'constant time' it is meant that a substantially similar amount of time is required to shift the contiguous subset of stored data regardless of the length of the contiguous subset. For example, an arbitrary length contiguous subset may be shifted in a single clock cycle, according to some examples. In another example, a shorter contiguous subset may need only a single clock cycle while a longer contiguous subset may require two or more clock cycles. However, while the block shift shiftable memory may use more time for longer subsets than relatively shorter subsets, the shift is still performed sufficiently quickly such that the shift can be viewed as occurring in substantially constant time since the time required is not strictly proportional to the contiguous subset length, according to some examples.

Herein, the term 'memory' refers to substantially any sort of memory that can receive and store data using cross-coupled elements. The memory is generally consistent with memory that may be employed by a computer processor or in a computer system as static memory that retains data without need for periodic data refresh, for example. Other types of static memory according to the definition herein include, but are not limited to, various types of latches, flip-flops, and shift registers that employ one or both of latches and flip-flops, for example. In particular, by definition herein, memory used for block shift shiftable memory generally refers to any sort of memory that is or may be referred to as static random access memory (SRAM). By definition herein, SRAM is memory that substantially maintains data without needing to be refreshed. Typically, SRAM maintains data using a feedback loop or a cross-coupling between components or elements of the SRAM cell. Herein, the block shift shiftable memory, and more specifically BS-SRAM, generally employs a particular type of SRAM referred to as 'dynamic/static' random access memory (D/SRAM) cells, described in more detail below.

Also herein, a memory (e.g., a BS-SRAM) may comprise a plurality of memory cells (e.g., D/SRAM cells) arranged as an array, according to some examples. For example, the memory cells may be arranged as a two dimensional (2-D) array. For example, the 2-D array may be arranged as a rectangular 2-D array of memory cells comprising a plurality of rows (i.e., a plurality of horizontally oriented linear arrays) and a plurality of columns (i.e., a plurality of vertically oriented linear arrays). In general, a memory cell is a member of both a row (e.g., row 5) and a column (e.g., column 8). High order (e.g., three or more dimensions) arrays also may be employed. In some examples, a loser order array (e.g., a linear array) is defined on an array with a larger dimension (e.g., 2-D array). A three dimensional (3-D) arrangement of memory cells may be realized using a plurality of adjacent 2-D arrays, according to some examples. In addition, arrays may be divided into sub-arrays. For example, a 2-D rectangular array may be divided into quadrants as four sub-arrays.

A memory cell (e.g., a D/SRAM cell) is a circuit or a related construct that holds or stores data, as defined and employed herein. Further, by definition herein, memory cells may generally store one or more 'bits' of data. For example, the bit may be or represent a binary value (e.g., '0' or '1') and the memory cell may hold a single bit. In another example, the memory cell may hold a plurality of binary value bits. For example, a memory cell may hold 4, 8, 16, 32 or 64 binary bits. In particular, the memory cell may hold or store a complete data word comprising the plurality of bits, as defined herein. In yet another example, the memory cell may hold data in another form (e.g., a hexadecimal value, an analog value, etc.). In particular, memory cells, as defined herein, are not restricted to storing data in a binary format but in some examples, may hold or store an arbitrary data construct. However, for discussion purposes herein, binary data and memory cells that hold a single data bit are generally employed throughout by way of example and not by way of limitation, unless otherwise stipulated.

As used herein, a 'row' is defined as a collection or grouping of memory cells arranged in a one-dimensional (1-D) array (e.g., a linear array). The 2-D array may comprise a plurality of rows arranged in a substantially parallel manner, for example. Further herein, a row comprising a grouping of memory cells may hold data (e.g., a plurality of data bits) that constitute one or more data words of a particular computer system. According to various examples, the memory cells of a row are physically adjacent to one another. For example, a first memory cell of a row may be located immediately next to a second memory cell of the row, and so on from the beginning end (e.g., left end) of the row to the terminal end (e.g., right end) of the row. A row may comprise a relatively large number of memory cells. For example, a length of a row may be 1024 data bits, 2048 data bits, 4096 data bits, or more, in various practical implementations, according to examples in accordance with the principles described herein.

Memory cells (e.g., D/SRAM cells of BS-SRAM) that are organized in rows and columns are also often referred to as 'memory locations' herein. Strictly speaking, a memory location is a memory cell(s) at a particular location within the memory, the location being designated or identified by an address (e.g., of a particular row and a particular column). The memory cell may be accessed using the address, for example. However, for simplicity of discussion herein, memory cells themselves are often referred to as having or being at an address. Similarly, a row of memory cells is typically referred to as having or being at a row address or row number, for example. As such 'location' and address of a row may be employed interchangeably herein. In addition, 'location' may be used to refer to a location of a contiguous subset of data that is designated by a starting row address of a block of rows and an ending row address of the block, according to some examples. In other examples, the location of the contiguous subset may be designated by a starting (or an ending) row address of a block of rows and a length (e.g., in terms of a number of rows) of the block. In some examples, a starting row address may be referred to as an 'INSERT' row or row address while an ending row address may be referred to as a 'DELETE' row or row address, for reasons that will become clear below.

Further herein and as noted above, a 'shift' as performed by the block shift shiftable memory is defined as a translation of a contiguous subset of data stored within the block shift shiftable memory, unless otherwise stipulated. In particular, by definition herein, a shift using the block shift shiftable memory constitutes the translation (e.g., up or down) of the stored data of the contiguous subset from a first location to a second location within the block shift shiftable memory. Furthermore, the shift, when applied to the contiguous subset of stored data, translates all of the stored data of the contiguous subset. Moreover, the shift by the block shift shiftable memory does not produce a translation or shift of data outside of the contiguous subset of data involved in the shift, by definition herein. However, the contiguous subset may comprise all of the memory locations or equivalently all of the rows of the block shift shiftable memory, according to some examples.

Herein, the direction 'up' is defined with respect to rows within the block shift shiftable memory as a direction toward locations having smaller row addresses. The direction 'down' is defined as a direction toward locations having larger row addresses. Hence, an 'upshift' is defined as shifting the data to a second location having a smaller row address than an address of a first or starting location. Conversely, a 'downshift' results in moving the data from a first location having a smaller row address to a second location with a larger row address. However, while the shift direction may be controllable or selectable according to some examples, the shift direction (e.g., up or down) may be completely arbitrary, as employed herein. Further, the specific use of 'upshift' and 'downshift' herein is for discussion purposes and not by way of limitation.

FIG. 1A illustrates an example of a downshift of a contiguous subset of data stored in a 2-D array within a block shift shiftable memory, according to an example consistent with of the principles described herein. In particular, FIG. 1A illustrates a plurality of rows of memory cells, each memory cell of which is capable of storing a single binary value or bit (e.g., a '1' or '0'), by way of example. Each memory cell in a particular row may be in a different column, for example. Further as illustrated, each of the rows is identified by an row address ranging from 00 to 11 while each column is identified by a column address ranging from a to f. A left side of FIG. 1A illustrates the plurality of rows before the downshift while a right side illustrates the same plurality of rows after the downshift.

As illustrated, the example downshift within the block shift shiftable memory comprises selecting a contiguous subset of stored data starting with a row at address 04 and ending with a row at address 08, for example. The block shift shiftable memory then downshifts the selected contiguous subset by moving the stored data in the selected rows down one row address location, as illustrated in the right side of FIG. 1A. The downshift maintains an order of the data within the contiguous subset and deposits the contiguous subset in rows between row address 05 and row address 09. Downshifting the stored data overwrites or substantially deletes the contents of a row immediately below the contiguous subset (i.e., contents at row address 09 before the downshift) and replaces the contents of that row with a last row of the downshifted contiguous subset (e.g., contents of row 08 before the downshift). Hence, the row at row address 09 may be referred to as the DELETE row, according to some examples.

Further, the contents of the row at address 04 is downshifted to the row at address 05 and after the downshift the row at address 04 is rendered indeterminate as indicated by the X's, as illustrated. According to various examples, the row at row address 04 may retain a copy of the data that was present before the downshift or may be cleared (e.g., set to '000 . . . ') after the downshift. In some examples, the row at row address 04 may be available for insertion of data from an external source, for example. As such, the row at row address 04 is denoted as the INSERT row, according to some examples.

FIG. 1B illustrates an example of an upshift of a contiguous subset of data stored in a 2-D array within a block shift shiftable memory, according to an example consistent with the principles described herein. In particular, FIG. 1B illustrates a plurality of rows of memory cells, each memory cell configured to store a plurality of data values or data words (e.g., 'abc,' 'cba,' 'aaa,' 'def . . . ,' etc.). Further as illustrated, each of the illustrated rows is identified by an address ranging from 00 to 11. A left side of FIG. 1B illustrates the plurality of rows before the upshift while a right side illustrates the same plurality of rows after the upshift.

As illustrated in FIG. 1B, the upshift in shiftable memory comprises selecting a contiguous subset of stored data starting with a row at row 03 and ending with a row at row address 06, for example. The shiftable memory then upshifts the selected contiguous subset by moving the stored data in the selected contiguous subset up one address location, as illustrated in the right side of FIG. 1B. The upshift maintains an order of the data within the contiguous subset and deposits the contiguous subset in rows between row address 02 and row address 05. Upshifting the stored data overwrites the contents of a row immediately above the contiguous subset (i.e., at address 02) and as such, replaces the contents of that row with data from a first row of the upshifted contiguous subset (i.e., contents at row address 03 before the upshift). Further, the row at row address 06 which originally held the data of the last row of the contiguous subset before the upshift is rendered indeterminate as indicated by the X's after the upshift. According to some examples, the row at row address 06 may retain a copy of the data that was present before the upshift or may be cleared (e.g., set to '000 . . . ') after the upshift. In some examples, the row at row address 06 may be available for insertion of data from an external source, for example. As such, the row at row address 06 may be considered the INSERT row while the row at row address 02 may be denoted as the DELETE row, according to the example illustrated in FIG. 1B.

According to various examples, the block shift shiftable memory may be a portion of a main memory of a general-purpose computer system. The block shift shiftable memory may represent a subset of the memory that makes up the main memory, for example. In another example, the block shift shiftable memory may be a shift register. The shift register may have a single memory cell in each row, for example.

Further, as used herein, the article 'a' is intended to have its ordinary meaning in the patent arts, namely 'one or more'. For example, 'a memory cell' means one or more memory cells and as such 'the memory cell' means 'the memory cell(s)' herein. Also, any reference herein to 'top', 'bottom', 'upper', 'lower', 'up', 'down', 'front', back', 'left' or 'right' is not intended to be a limitation herein. Further, the terms 'column and 'row' are arbitrary designations to describe substantially orthogonal structures when employed in a describing an array. As such, a row may be viewed as a column and a column may be viewed as a row under an appropriate rotation of an array or similar structure containing the rows and columns. Herein, the term 'about' when applied to a value generally means within the tolerance range of the equipment used to produce the value, or in some examples, means plus or minus 10%, or plus or minus 5%, or plus or minus 1%, unless otherwise expressly specified. Moreover, examples herein are intended to be illustrative only and are presented for discussion purposes and not by way of limitation.

FIG. 2 illustrates a block diagram of a dynamic/static random access memory (D/SRAM) cell 100, according to an example consistent with the principles described herein. According to various examples, the D/SRAM cell 100 is a memory cell that provides both a dynamic storage mode and a static storage mode, by definition herein. In particular, the D/SRAM cell 100 may be selectably operated in or switched in situ between the dynamic storage mode and the static storage mode. When operated in static storage mode, the D/SRAM cell 100 acts substantially similar to an SRAM cell to maintain stored data without refresh. Alternatively, when switched to dynamic storage mode, the D/SRAM cell 100 exhibits a time decay of stored data that substantially mimics dynamic random access memory (DRAM), for example. The time decay may be provided by a capacitance (e.g., a gate capacitance) of an element or elements of the D/SRAM cell 100, for example. According to some examples, the dynamic storage mode is employed when the D/SRAM cell 100 is operated as a load/store shift register.

As illustrated, the D/SRAM cell 100 has an input port 102 to receive data and an output port 104 to output data stored by the D/SRAM cell 100. In some examples, the input port 102 and the output port 104 may be employed to one or both of shift data into and shift or couple data out of the D/SRAM cell 100. Specifically, when the D/SRAM cell 100 is operated as a load/store shift register utilizing a combination of the dynamic storage mode to load data and the static storage mode to store the loaded data, the load/store input port 102 may be connected to an adjacent memory cell (e.g., an adjacent D/SRAM cell 100) that supplies the data being loaded, according to some examples. Further in some examples, the output port 104 may be connected to another adjacent memory cell (e.g., another D/SRAM cell 100) for shifting or coupling data out of the D/SRAM cell 100, for example.

In some examples, the D/SRAM cell 100 may have other input/output (I/O) ports (not illustrated FIG. 2). For example, the D/SRAM cell 100 may have one or more other I/O ports in communication with a bit line or a pair of bit lines of a memory array that employs the D/SRAM cell 100. The other I/O ports may used to one or both of write data to and read data from the D/SRAM cell 100 when the D/SRAM cell 100 is operated in static storage mode as a memory cell of a random access memory array (e.g., as an SRAM array), for example. The bit line(s) are not explicitly depicted in FIG. 2 for simplicity of illustration, but will be addressed below (e.g., see FIGS. 3A-3C).

Further, FIG. 2 illustrates a plurality of D/SRAM cells 100 arranged and interconnected in a column, by way of example and not limitation. As illustrated, an output port 104 of a particular D/SRAM cell 100' of the plurality is connected to both of an input port 102 of an adjacent D/SRAM cell 100" below the particular D/SRAM cell 100' and an input port of an adjacent D/SRAM cell 100'" above the particular D/SRAM cell 100' in the column. In some examples (not illustrated), the particular D/SRAM cell 100' may be connected to either the below-adjacent D/SRAM cell 100" or the above-adjacent D/SRAM cell 100'", but not both. Connection to both adjacent D/SRAM cells 100", 100'" may facilitate selectable upshifting and downshifting of data within the column when the D/SRAM cells 100 are operated as a load/store shift register, for example. Alternatively, a single direction connection of the particular D/SRAM cell 100', for example to either the below-adjacent D/SRAM cell 100" or above-adjacent D/SRAM cell 100'", may facilitate unidirectional (i.e., either downshift or upshift) data translation within the column. Also according to some examples (not illustrated), one or both of the adjacent D/SRAM cells 100", 100'" below and above the particular D/SRAM cell 100' may be realized as other than a D/SRAM cell (e.g., as a conventional SRAM cell). Further, the column illustrated in FIG. 2 may be either a stand-alone column (e.g., implementing a 1-bit wide shift register) or a representative column of a plurality of columns of a 2-D memory array, according to various examples.

Referring to FIG. 2, the D/SRAM cell 100 comprises a static random access memory (SRAM) cell 110. According to various examples, the SRAM cell 110 is a memory cell configured to provide substantially static data storage without a need for data refresh to maintain the stored data. As illustrated, the SRAM cell 110 comprises a pair of cross-coupled elements 112, 114. The cross-coupled elements 112, 114 are configured to provide data storage through or as a result of a cooperative interaction or a 'cross coupling' between the cross-coupled elements 112, 114. In particular, the cross coupling of the cross-coupled elements 112, 114 may act as a signal feedback loop that cooperatively reinforces a programmable logic state of the SRAM cell 110 to store the data, according to various example. A circuit (e.g., a driver) external to the SRAM cell 110 may provide programming of the programmed logic state, in some examples. For example, programming may be provided by a driver via bit lines (not illustrated). After programming, the cross coupling maintains the programmed logic state, according to some examples. In some examples, the cross-coupled elements 112, 114 of the SRAM cell 110 are also often referred to as a latch or latch circuit.

In some examples, the cross-coupled elements 112, 114 comprise a pair of cross-coupled inverters 112, 114. In some examples, the pair of cross-coupled inverters 112, 114 may comprise a first inverter 112 cross-coupled by a cross-coupling connection to a second inverter 114. In some examples, the first and second inverters 112, 114 may be cross-coupled such that an output signal of the first inverter 112 is communicated by the cross-coupled connection to an input of the second inverter 114. Similarly, the cross-coupled connection may communicate an output signal of the second inverter 114 to an input of the first inverter 112, for example. The operation of the inverters 112, 114 in conjunction with the cross-coupling connection functions as a feedback or coupled circuit that is bi-stable having the capability to store data. In other examples (not illustrated in FIG. 2), elements other than or in addition to a pair of inverters 112, 114 may be employed as the cross-coupled elements 112, 114.

Further as illustrated, the D/SRAM cell 100 further comprises a dynamic/static (D/S) mode selector 120. The D/S mode selector 120 is configured to selectably switch the D/SRAM cell 100 between the dynamic storage mode and the static storage mode. When the D/S mode selector 120 switches the D/SRAM cell 100 into static storage mode, the SRAM cell 110 maintains the programmed logic state substantially without decay or degradation (i.e., at least until the SRAM cell 110 is reprogrammed). Alternatively, when the D/S mode selector 120 selectably switches the D/SRAM cell 100 to dynamic storage mode, the logic state previously stored in or by the SRAM cell 110 decays over time, by definition herein.

According to various examples, the D/S ode selector 120 is configured to produce the dynamic storage mode by interrupting the signal feedback loop of the SRAM cell 110. In particular, the signal feedback loop is interrupted by substantially breaking or decoupling the cross-coupling connection between the cross-coupled elements 112, 114 of the SRAM cell 110. Decoupling the cross-coupling connection also substantially isolates the cross-coupled elements 112, 114 from one another, according to some examples.

According to some examples, the D/S mode selector 120 comprises a switch to selectably couple and decouple/isolate the pair of cross-coupled elements 112, 114 of the SRAM cell 110. The dynamic storage mode of the D/SRAM cell 100 corresponds to the cross-coupled elements 112, 114 being decoupled and the static storage mode corresponds to the cross-coupled elements being coupled. Thus, selectably decoupling the cross-coupled elements 112, 114 of the pair using the switch produces the dynamic storage mode of the D/SRAM cell 100 while selectably coupling between the pair of cross-coupled elements 112, 114 with the switch provides the static storage mode, according to various examples.

In some examples, the switch may be located in or be a part of the cross-coupling connection. For example, the switch may comprise a first switch 122. The first switch 122 may be connected between the output of the first cross-coupled element 112 (e.g., first invert 112) and the input of the second cross-coupled element 114 (e.g., second inverter 114) as part of the cross-coupling connection, for example. When the first switch 122 is turned off or is in an OFF condition (e.g., a high impedance condition or an open switch), the output of the first cross-coupled element 112 is substantially disconnected or decoupled and isolated from the input of the second cross-coupled element 114. Alternatively, when the first switch is turned on or in an ON condition (e.g., a low impedance condition or a closed switch), coupling is facilitated between the first cross-coupled element output and second cross-coupled element input. The first switch 122 may be controlled by or according to a control signal F1, for example.

In some examples, the switch may further comprise a second switch 124. The second switch 124 may be connected, as part of the cross-coupling connection, between the output of the second cross-coupled element 114 (e.g., second inverter 114) and the input of the first cross-coupled element 112 (e.g., first inverter 112), for example. When the second switch 124 is turned off or in an OFF condition (e.g., a high impedance condition or an open switch), the output of the second cross-coupled element 114 is substantially disconnected or decoupled and isolated from the input of the first cross-coupled element 112. Alternatively, when the second switch is turned on or in an ON condition (e.g., a low impedance condition or a closed switch), coupling is facilitated between the second cross-coupled element output and first cross-coupled element input. The second switch 124 may be controlled by or according to a control signal B1, for example.

According to some examples, the D/S mode selector 120 may configure the D/SRAM cell 100 to operate in the dynamic storage mode when both of the first and second switches 122, 124 are in the OFF condition. The selectable decoupling provided by the first and second switches 122, 124 may substantially defeat the cross-coupling of the cross-coupled inverters 112, 114, to provide the dynamic storage mode, according to some examples. Further, the selectably decoupling substantially isolates the cross-coupled inverters 112, 114 from one another. According to various examples, one or both of the first and second switches 122, 124 may comprise a transistor switch. Examples of a transistor switch include, but are not limited to, a series-connected metal oxide (MOS) transistor (e.g., an NMOS or a PMOS transistor) and a transmission gate comprising a parallel connection of an NMOS transistor and a PMOS transistor.

In some examples, the D/SRAM cell 100 further comprises a load/store (L/S) coupler 130. The L/S coupler 130 is configured to selectably couple data (e.g., a logic '1' or a logic '0') from an external source into the D/SRAM cell 100. The external data source may be an adjacent memory cell, for example. The data coupled by the L/S coupler 130 may be loaded by the D/SRAM cell 100 in the dynamic storage mode and then subsequently stored in the D/SRAM cell 100 when the D/SRAM cell 100 is switched from dynamic storage mode to static storage mode following data loading, according to various examples.

In some examples, the L/S coupler 130 comprises a first switch 132. For example, the first switch 132 may be connected between a first load/store input of the input port 102 of the D/SRAM cell 100 and the input of the first cross-coupled element 112 (e.g., the inverter 112) of the SRAM cell 110. The first switch 132 may be configured to selectably couple data from a first adjacent memory cell into the SRAM cell 110 when the first switch 132 is turned on or in an ON condition (i.e., ON=closed switch), for example. In an OFF condition (i.e., OFF=open switch), the first switch 132 substantially blocks coupling from the first adjacent memory cell, according to various examples. The first adjacent memory cell may be the above-adjacent D/SRAM cell 100''' illustrated in FIG. 2, for example. The data coupling provided by the first switch 132 may facilitate downshifting data in a column having the D/SRAM cell 100, for example.

In some examples, the L/S coupler 130 comprises a second switch 134. For example, the second switch 134 may be connected between a second load/store input of the input port 102 of the D/SRAM cell 100 and the input of the second cross-coupled element 114 (e.g., the inverter 114) of the SRAM cell 110. The second switch 134 may be configured to selectably couple data from a second adjacent memory cell into the SRAM cell 110 when the second switch 134 is turned on or in an ON condition, for example. In an OFF condition the second switch 134 substantially blocks coupling from the second adjacent memory cell, according to various examples. The second adjacent memory cell may be the below-adjacent D/SRAM cell 100'' illustrated in FIG. 2, for example. The coupling provided by the second switch 134 may facilitate upshifting data in a column having the D/SRAM cell 100, for example.

By definition herein, when the D/SRAM cell 100 is in dynamic storage mode and the first switch 132 is employed to couple data into the first cross-coupled element 112, the first cross-coupled element 112 may be referred to as a 'master' (e.g., a 'master' inverter 112) while the second cross-coupled element 114 may be referred to as a 'slave' (e.g., a 'slave' inverter 114). Alternatively, when the D/SRAM cell 100 is in dynamic storage mode and the second switch 134 is employed to couple data into the second cross-coupled element 114, the second cross-coupled element 114 may be referred to a 'master' (e.g., a 'master' inverter 114) while the first cross-coupled element 112 may be referred to as a 'slave' (e.g., a 'slave' inverter 112), by definition herein. As such, the master cross-coupled element is a cross-coupled element 112, 114 of the pair that is configured by the L/S coupler 130 to receive data being loaded in the D/SRAM cell 100 in dynamic mode. Further, the slave cross-coupled element is a cross-coupled element 112, 114 of the pair that is isolated from the master cross-coupled element. In some examples, the slave cross-coupled element of an adjacent D/SRAM cell 100 may serve as a source of the data being coupled into the master cross-coupled element by the L/S coupler 130.

Figure 3A:
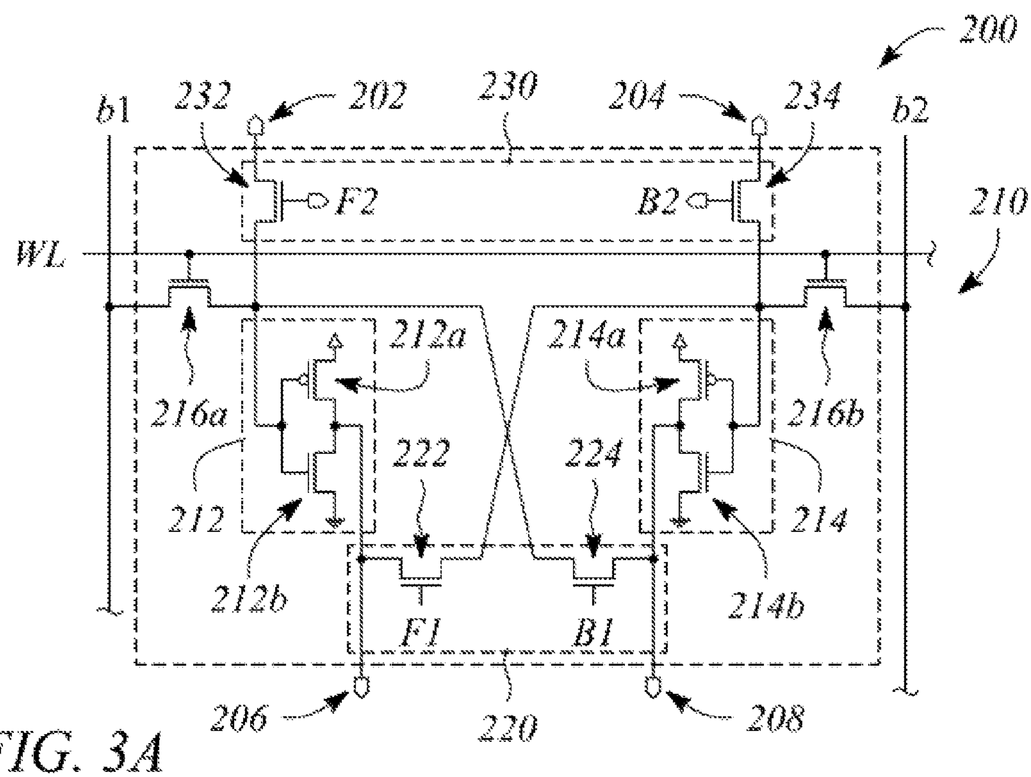
FIG. 3A illustrates a schematic diagram of a D/SRAM cell, according to an example consistent with the principles described herein.

FIG. 3A illustrates a schematic diagram of a D/SRAM cell 200, according to an example consistent with the principles described herein. According to some examples, the D/SRAM cell 200 illustrated in FIG. 3A may be substantially similar to the D/SRAM cell 100 described above with respect to FIG. 2. In particular, the D/SRAM cell 200 comprises an SRAM cell 210, a dynamic/static (D/S) mode selector 220 and a load/store (L/S) coupler 230, each of which is substantially similar to respective ones of the SRAM cell 110, D/S mode selector 120, and L/S coupler 130 of the D/SRAM cell 100.

As illustrated in FIG. 3A, the SRAM cell 210 comprises a six transistor (6T) SRAM cell 210. The illustrated 6T SRAM cell 210 comprises a first inverter 212 implemented using a pair of transistors 212*a*, 212*b* and a second inverter 214 implemented using another pair of transistors 214*a*, 214*b*. The first or upper transistor 212*a*, 214*a* of each of the inverters 212, 214 are illustrated in FIG. 3A as PMOS transistors while a second or lower transistor 212*b*, 214*b* of each of the inverters 212, 214 are illustrated as NMOS transistors by way of example and not limitation. The first inverter 212 is cross-coupled to the second inverter 214 by a cross-coupling circuit. The cross-coupled first and second inverters 212, 214 function to store data in the 6T SRAM cell 210. The 6% SRAM cell 210 further comprises a pair of access transistors 216*a*, 216*b*. The access transistors 216*a*, 216*b* connect to a pair of bit lines b1 and b2 to facilitate writing to and reading from the 6T SRAM cell 210 when the D/SRAM cell 200 is operated as a memory cell of a random access memory in static storage mode. The access transistors

216*a*, 216*b* are activated by a word line WL and the bit lines b1 and b2 may be inverses of one another (e.g., $b2=\overline{b1}$), according to some examples.

As illustrated, the D/S mode selector 220 of the D/SRAM cell 200 comprises a pair of transistor switches 22, 224 in the cross-coupling circuit between the first and second inverters 212, 214. Asserting a control signal (e.g., at ports F1 and B1) that places the pair of transistor switches 222, 224 in an OFF condition (i.e., turning off the transistor switches 222, 224) decouples and isolates the cross-coupling of the first and second inverters 212, 214 from one another to provide the dynamic storage mode of the D/SRAM cell 200. The static storage mode is provided by a control signal (e.g., at ports F1 and B1) that places the transistor switches 222, 224 in an ON condition. As illustrated, the pair of transistor switches 222, 224 of the D/S mode selector 220 is illustrated as NMOS transistors. In other examples (not illustrated) the D/S mode selector 220 may comprise PMOS transistors or a combination of NMOS and PMOS transistors.

Further as illustrated, the L/S coupler 230 comprises a pair of transistor switches 232, 234. Asserting a control signal (e.g., at port F2) that places a first transistor switch 232 of the pair in an ON condition (i.e., turned on) allows data at a first load/store input 202 of the D/SRAM cell 200 to be coupled into and affect a state of the first inverter 212. In particular, the state of the first inverter 212 may be affected by the data coupled through the first transistor switch 232 when the D/SRAM cell 200 is in dynamic storage mode, for example. Further, when the first transistor switch 232 is turned on, the first inverter 212 is the master inverter. Similarly, asserting a control signal (e.g., at port B2) that places a second transistor switch 234 of the pair in an ON condition (i.e., turned on) allows data at a second load/store input 204 of the D/SRAM cell 200 to be coupled into and affect a state of the second inverter 214 when the D/SRAM cell 200 is in dynamic storage mode, for example. Further, when the second transistor switch 234 is turned on, the second inverter 214 is the master inverter. As illustrated, the pair of transistor switches 232, 234 of the L/S coupler 230 is illustrated as NMOS transistors. In other examples (not illustrated), the L/S coupler 230 may comprise PMOS transistors or a combination of NMOS and PMOS transistors.

According to some examples, data in the D/SRAM cell 200 may be coupled into an adjacent D/SRAM cell 200 through one or both of output port 206 and output port 208, as illustrated. For example, output port 206 of the D/SRAM cell 200 may be connected to a first load/store input port of a below-adjacent D/SRAM cell (not illustrated) to facilitate data downshifting. The output port 208 of the D/SRAM cell 200 may be connected to a second load/store input port of an above-adjacent D/SRAM cell (not illustrated) to facilitate data upshifting, for example. Further as illustrated, when data is coupled out of the output port 208, the second inverter 214 is the slave inverter while the first inverter 212 is the slave inverter when data is coupled out of the output port 206. Data may be selectably coupled out of the output ports 206, 208 by an L/S coupler of an adjacent D/SRAM cell (not illustrated), for example.

As such, data may be loaded into and stored by the D/SRAM cell 200, as discussed above, by selectively turning on and off various ones of the transistor switches 222, 224, 232 and 234. For example, the D/SRAM cell 200 may be placed in dynamic storage mode by turning off or placing the transistor switches 222, 224 in the OFF condition. Then data at a selected one of the first and second load/store inputs 202, 204 may be coupled in the D/SRAM cell 200 by turning on or placing a selected one of the first and second transistor switches 232, 234 of the L/S coupler 230 in the ON condition to load the data.

After the data is loaded into a selected one of the first and second inverters 212, 214, according to which of the L/S coupler transistor switches 232, 234 are turned on, the static storage mode of the D/SRAM cell 200 may be re-established by placing the pair of transistor switches 222, 224 of the D/S mode selector 220 in the ON condition to store the coupled data. According to some examples, the L/S coupler transistor switches 232, 234 may be turned off at the same time or just prior to the re-establishment of the static storage mode to avoid possible coupled data corruption.

Further, the respective transistor switch 222, 224 at the output of the master inverter may be turned on prior to the other respective transistor switch 222, 224 at the output of the slave inverter to avoid a potential race condition, according to some examples. For example, if the data was loaded by the first transistor switch 232 of the L/S coupler 230 into the first inverter 212, then the first inverter 112 is the master inverter. In this example, the first transistor switch 222 may be placed in an ON condition first, followed by the second transistor switch 224 to avoid a race condition.

Figure 3B:
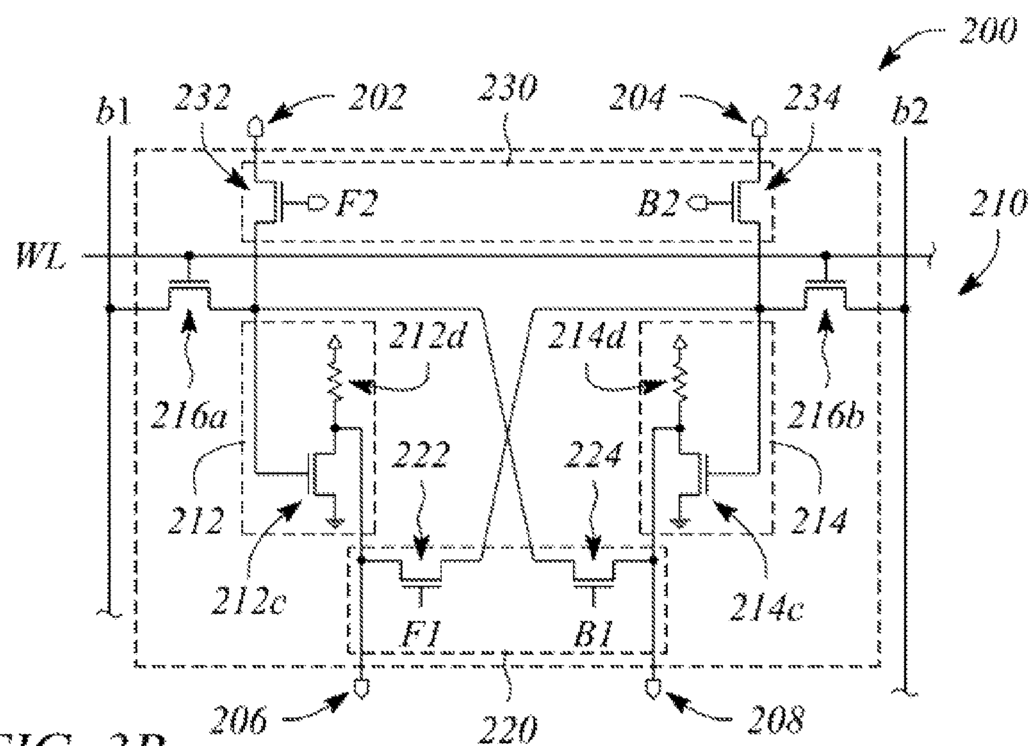
FIG. 3B illustrates a schematic diagram of a D/SRAM cell, according to another example consistent with the principles described herein.

FIG. 3B illustrates a schematic diagram of a D/SRAM cell 200, according to another example consistent with the principles described herein. In the example illustrated in FIG. 3B, the SRAM cell 210 is realized as a four-transistor (4T) SRAM cell 210. The 4T SRAM cell 210 is substantially similar to the 6T SRAM cell 210 except that the first and second inverters 212, 214 are each implemented using a single respective transistor 212*c*, 214*c* along with a respective bias resistor 212*d*, 214*d*, instead of a pair of transistors. The D/SRAM cell 200 of FIG. 3B also comprises the D/S mode select 220 implemented by the pair of transistor switches 222, 224 (e.g., at ports F1 and B1) and the L/S coupler 230 implemented by the pair of transistor switches 232, 234 (e.g., at ports F2 and B2), as illustrated, according to this example.

Table 1 summarizes operation of the D/SRAM cell 200 in terms of switch states of the various transistor switches 222, 224, 232, 234 identified by their corresponding switch ports (i.e., F1, F2, B1 and B2). In particular, Table 1 includes the switch states of the D/SRAM cell 200 in both static storage mode and dynamic storage mode. Switch states for an upshift as well as a downshift of data in a column of D/SRAM cells 200 are also provided.

TABLE 1

D/SRAM storage mode vs. switch states identified by switch ports.

| Storage Mode | F1 | B1 | F2 | B2 |
|---|---|---|---|---|
| Static | ON | ON | OFF | OFF |
| Dynamic - Upshift | OFF | OFF | OFF | ON |
| Dynamic - Downshift | OFF | OFF | ON | OFF |

Other SRAM cells may be substituted for either of the 4T SRAM cell 210 or the 6T SRAM cell 210 illustrated in FIGS. 3A and 3B, according to some examples. For example, the 4T SRAM cell 210 of FIG. 3B may be replaced by a so-called 'loadless' 4T SRAM cell (not illustrated). In other examples, other SRAM cells such as, but not limited to, an eight-transistor (8T) SRAM cell and a ten-transistor (10T) SRAM cell (not illustrated) may be employed in place of the 6T SRAM cell 210, illustrated in FIG. 3A. All such substitutions are within the scope of the principles described herein.

Figure 4A:
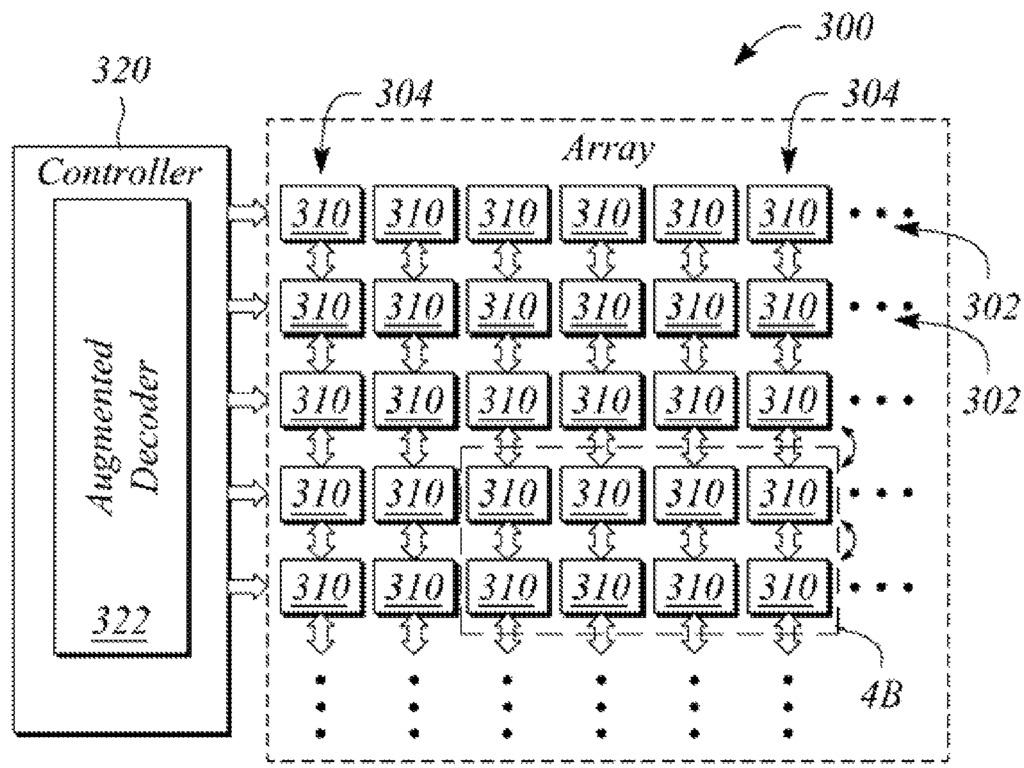
FIG. 4A illustrates a block diagram of block shift static random access memory (BS-SRAM), according to an example consistent with the principles described herein.
Figure 4B:
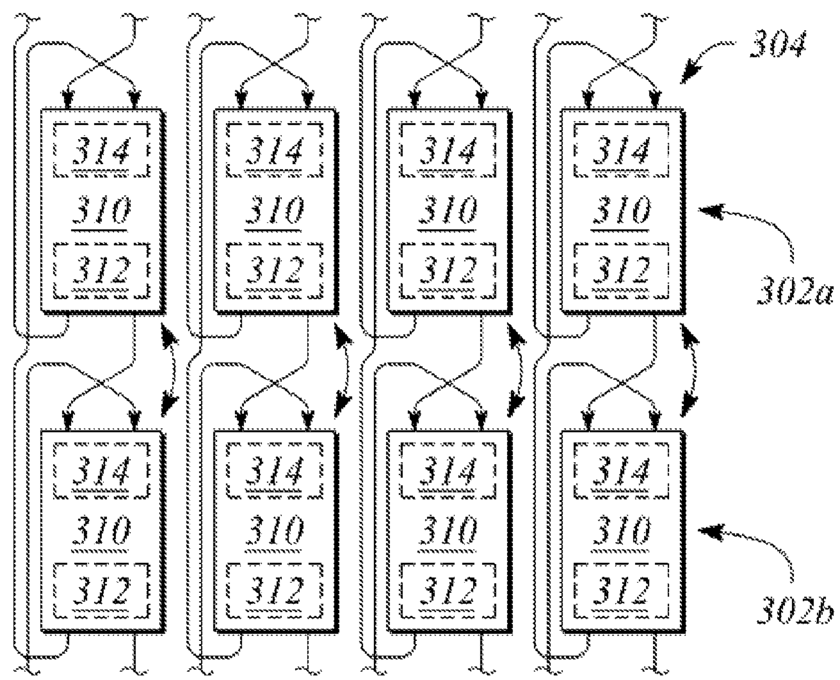
FIG. 4B illustrates an expanded block diagram of a portion of the BS-SRAM illustrated in FIG. 4A, according to an example consistent with the principles described herein.

FIG. 4A illustrates a block diagram of block shift static random access memory (BS-SRAM) 300, according to an example consistent with the principles described herein. FIG. 4B illustrates an expanded block diagram of a portion of the BS-SRAM 300 illustrated in FIG. 4A, according to an example consistent with the principles described herein. The BS-SRAM 300 comprises a plurality of dynamic/static random access memory (D/SRAM) cells 310 arranged in an array having a plurality of rows 302 and a plurality of columns 304. In some examples, a column 304 may comprise a D/SRAM cell 310 in a first row 302*a* and an adjacent D/SRAM cell 310 in a second row 302*b* of the array, as illustrated in FIG. 4B, for example. In various examples, the D/SRAM cells 310 of the plurality may be substantially similar to the D/SRAM cell 100 described above. In particular, in some examples, the D/SRAM cells 310 of the plurality may comprise a dynamic/static (D/S) mode selector 312 that is substantially similar to the D/S mode selector 120 described above. Also the D/SRAM cell 300 may further comprise a load/store (L/S) coupler 314 that is substantially similar to the L/S coupler 130 described above, according to some examples.

In particular, the D/S mode selector 312 may comprise a decoupling switch between cross-coupled elements of the D/SRAM cell 310, in some examples. The decoupling switch may be configured to provide switching between a dynamic and a static storage mode using selectable coupling and decoupling of the cross-coupled elements, for example. The decoupling switch may be substantially similar to the switch, for example the pair of switches 122, 124, described above with respect to the D/SRAM cell 100, according to various examples.

In some examples, the L/S coupler 314 may comprise a pair of switches to selectively couple data into the D/SRAM cell 310 from adjacent D/SRAM cells 310 in a column of the BS-SRAM 300. The pair of switches of the L/S coupler 314 illustrated in FIGS. 4A and 4B may be substantially similar to the first and second switches 132, 134 of the L/S coupler 130 described with respect to the D/SRAM cell 100, according to some examples. For example, when the plurality of D/SRAM cells 310 in a column of the BS-SRAM 300 includes both of a D/SRAM cell 310 in the first row and an adjacent D/SRAM cell 310 in a second row above the first row, the L/S coupler 314 of the first row D/SRAM cell 310 may comprise a first switch connected to an output of the adjacent D/SRAM cell 310 in the second row. The first switch may be configured to downshift data in the column from the second row D/SRAM cell 310 to the first row D/SRAM cell 310, for example. In an example in which the column further includes another adjacent D/SRAM cell 310 in a third row below the first row, the L/S coupler 314 may comprise a second switch connected to an output of the other adjacent D/SRAM cell in the third row. The second switch may be configured to upshift data in the column from the third row D/SRAM cell to the first row D/SRAM cell, for example.

Referring again to FIG. 4A, the BS-SRAM 300 further comprises a controller 320. The controller 320 is configured to shift data from an adjacent D/SRAM cell 310 to the D/SRAM cell 310 in a first row (illustrated as curved, double-headed arrows in FIGS. 4A and 4B). The data is shifted by selective activation of the L/S coupler 314 and the D/S mode selector 312 of the first row D/SRAM cell 310 by the controller 320, according to various examples. For example, the adjacent D/SRAM cell 310 may be the D/SRAM cell 310 in the second row (e.g., a row above the first row). In another example, the adjacent D/SRAM cell 310 may be the D/SRAM cell 310 of the third row (e.g., a row below the first row). As such, the controller 320 acting in conjunction with the L/S coupler 314 and D/S mode selector 312 of the first row D/SRAM cell 310 may selectably upshift or downshift data between rows and more specifically upshift or downshift data between rows and within columns of the BS-SRAM 300, according to various examples.

In some examples, the controller 320 is configured to select a subset of rows in the array. In particular, the controller 320 may select rows between an INSERT row and a DELETE row, in some examples. The controller 320 may select the subset of row between the INSERT row and the DELETE row by asserting a corresponding set of row control signals, for example. The row control signals asserted by the controller 320 may be communicated to the rows by row control lines, according to some examples.

According to some examples, the controller 320 is further configured to shift data between D/SRAM cells 310 only within the selected subset of rows. In some examples, the shifted rows of data may represent a contiguous subset of the data stored in the BS-SRAM 300, for example. According to some examples, the contiguous subset of data has a size that is smaller than a total storage size of the BS-SRAM 300. Further, the data shifting provided by the controller 320 of the BS-SRAM 300 only shifts data stored inside the contiguous subset when the contiguous subset is shifted by or under the control of the controller 320. To shift the data, the controller 320 may provide the control signals F1, B1, F2 and B2, to the D/SRAM cells 310, as appropriate.

In some examples, the DELETE row may represent a row at a terminal end of the contiguous subset that is overwritten by an adjacent row of data when the data is shifted in the BS-SRAM 300. Hence, data in the DELETE row is substantially deleted by the shifting the data under the control of the controller 320, according to some examples. The INSERT row may represent a row that is available for inserting new data after the data is shifted in the BS-SRAM 300, for example. In particular, the INSERT row may be located at a beginning of the contiguous subset such that when the data is shifted a space is created at the beginning of the contiguous subset corresponding to the INSERT row for the insertion of a new row of data, in some examples. Further, according to various examples, a shift direction (e.g., up or down) is generally defined as being from the beginning end (i.e., from the INSERT row) toward the terminal end (i.e., toward the DELETE row) of a span of rows that contain the contiguous subset (i.e., the selected subset of rows). As such, when the INSERT row is above (e.g., has a smaller address than) the DELETE row, the data shift is defined as a downshift or a shift in the down direction. Alternatively, when the INSERT row is below the DELETE row, the data shift is an upshift or a shift in the up direction within the BS-SRAM 300, according to various examples. Of course, since the direction of the data shift determines which end of the span of rows is the INSERT row and which end is the DELETE row, a subset of rows may be designated along with a shift direction to identify the INSERT row and the DELETE row, according to some examples.

In some examples, the controller 320 comprises an augmented decoder 322. The augmented decoder 322 employs information regarding the address and length (or alternatively the first and last memory cell addresses) to select the contiguous subset of stored data in a block of rows 302. In some examples, the augmented decoder 322 uses the information (e.g., address and length of the contiguous subset) to assert an output corresponding to each of the subset of row 302 within the BS-SRAM 300. Asserting an output may comprise outputting a logic '1' on a connection path or wire (e.g., a row control line) between the augmented decoder 322 and the BS-SRAM 300, for example. As such, the augmented decoder 322 may output a logic '1' on a plurality of row control lines of the BS-SRAM 300, wherein the row control lines corresponds to the subset of rows that contain the stored data of the selected contiguous subset. In other examples, asserting an output comprises outputting a logic '0'. As such, the augmented decoder 322 is configured to provide a plurality of row control signals to select the subset of rows between the INSERT row and the DELETE row, according to various examples. The row control lines, in turn, may be employed by the controller to route the signals F1, B1, F2 and B2 (not illustrated in FIG. 4A or 4B), to the appropriate ports (e.g., ports F1, B1, F2 and B2 (not illustrated in FIG. 4A or 4B) of the D/DRAM cells 310) of the selected subset of rows according to some examples.

Figures 5, 6:
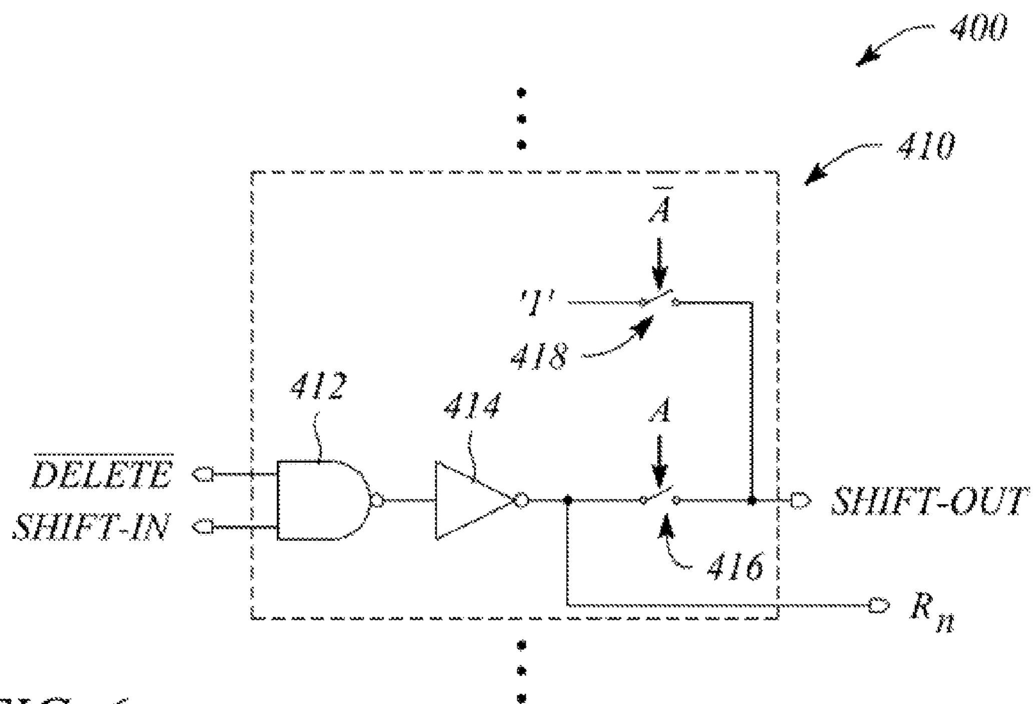
FIG. 5 illustrates a partial truth table of an example augmented decoder illustrated in FIG. 4A, according to an example of the principles described herein.
FIG. 6 illustrates a schematic diagram of a portion of an augmented decoder that employs a ripple cascade, according to an example of the principles described herein.

FIG. 5 illustrates a partial truth table of an example augmented decoder 322 illustrated in FIG. 4A, according to an example of the principles described herein. In particular, the example augmented decoder 322 corresponding to the illustrated truth table is configured to select the subset of rows in an example BS-SRAM 300 having eight rows. The truth table has three address inputs (ADDR), a length (LEN) input and eight row control lines R (i.e., $R_0$-$R_7$). As illustrated by the truth table, for a value of LEN equal to '00', the example augmented decoder 322 functions substantially similar to a conventional decoder (i.e., only one row control line R is asserted at a time). However, a plurality of row control lines R are asserted for all other values of LEN facilitating simultaneous selection of a corresponding plurality of rows corresponding to the selected subset of rows that hold or store the contiguous subset of stored data to be shifted in accordance with the principles described herein.

In some examples, the augmented decoder 322 may be implemented using a read only memory (ROM). The ROM may be programmed with a truth table that specifies the functionality of the augmented decoder 322, for example. A decoder of the ROM decodes an input (e.g., ADDR and LEN) and the programmed connections within the ROM augment the output of the ROM decoder to produce the augmented decoder 322 functionality, for example. In another example, a conventional decoder or a pair of conventional decoders (e.g., one each to decode an address of the INSERT row and to decode an address of the DELETE row) may be augmented with an output circuit other than the programmed connections to implement the augmented decoder 322. In other examples, the augmented decoder 322 may be implemented using a ripple cascade.

FIG. 6 illustrates a schematic diagram of a portion 400 of an augmented decoder 322 that employs a ripple cascade, according to an example of the principles described herein. In particular, the augmented decoder portion 400 illustrated in FIG. 6 is configured to assert one or more row control lines R (illustrated in FIG. 5, for example) corresponding to the subset of rows to be selected. According to various examples, the augmented decoder portion 400 illustrated in FIG. 6 may receive an INSERT signal. For example, the INSERT signal may be provided by a first conventional decoder (not illustrated) that decodes an address of the INSERT row. The INSERT signal corresponds to the INSERT row of the BS-SRAM 300 (illustrated in FIG. 4A, for example) and may be latched, in some examples. In some examples, an inverse of the INSERT signal (i.e., denoted '$\overline{\text{INSERT}}$') may also be provided, for example. Augmented decoder portion 400 may further receive as an input, an inverse DELETE signal (e.g., denoted '$\overline{\text{DELETE}}$'), according to various examples. The $\overline{\text{DELETE}}$ signal corresponds to the DELETE row of the BS-RAM 300 and may also be latched, in some examples. The augmented decoder portion 400 may also receive a SHIFT signal and a $\overline{\text{SHIFT}}$ signal that are asserted when a shift is to take place. The SHIFT and $\overline{\text{SHIFT}}$ signals may be provided by another portion of the controller 320 (not illustrated), for example.

As illustrated, the augmented decoder portion 400 illustrated in FIG. 6 comprises a ripple cascade of a plurality of fast delay circuits 410, however, only one of such fast delay circuits 410 is illustrated for simplicity of illustration and discussion. Ellipses illustrated in FIG. 6 indicate the presence of other fast delay circuits 410. Each row 302 of the BS-SRAM 300 (of FIGS. 4A and 4B) has an associated one of the fast delay circuits 410 of the ripple cascade to supply a row control signal $R_n$ to the row 302. The row control signal $R_n$ may act as an input to a multiplexer (not illustrated) at each row 302 to control distribution of the control signals F1, F2, B1 and B2 (described above and illustrated in FIGS. 2, 3A and 3B) to the various rows. The control signals F1, B1, F2 and B2 may be provided by a global clock circuit (not illustrated) of the controller 320, for example.

Illustrated in FIG. 6, each fast delay circuit 410 comprises an input NAND gate 412, an inverter 414, a first switch 416 and a second switch 418. An output of the NAND gate 412 is connected to an input of the inverter 414. An output of the inverter 414 is routed through the first switch 416 to a SHIFT-OUT port of the fast delay circuit 410. The output of the inverter 414 further provides the row control signal $R_n$ to the row 302. An input of the second switch 418 is tied to a logic '1' while an output of the second switch 418 is connected to the SHIFT-OUT port. The NAND gate 412 of each fast delay circuit 410 has a SHIFT-IN port to receive an output from the SHIFT-OUT port of an adjacent fast delay circuit 410. For example, an adjacent fast delay circuit 410 may be for a row 302 that is closer to an INSERT row end of the DS-SRAM 300. The NAND gate 410 also receives an input corresponding to the $\overline{\text{DELETE}}$ signal at another input port. The first switch 416 is controlled (e.g., closed) by a first switch control signal A while the second switch 418 is controlled (e.g., closed) by a second switch control signal $\overline{\text{A}}$. In some examples, the first switch control signal A is provided by a logical AND of the $\overline{\text{INSERT}}$ signal and the SHIFT signal while the second switch control signal $\overline{\text{A}}$ may be provided by a logical AND of the INSERT signal and the $\overline{\text{SHIFT}}$ signal.

In operation, initially all row control outputs are set to a logic '0' state. When a shift is initiated, the first switch 416 is opened (i.e., turned off) and the second switch 418 is closed (i.e., turned on) in the fast delay circuit 410 corresponding to the INSERT row 302. Closing the second switch 418 facilitates injection of a logic '1' into the ripple cascade. The injected logic '1' propagates along the ripple cascade from SHIFT-OUT to SHIFT-IN of adjacent fast delay circuits 410 until the DELETE row 302 is reached. At the fast delay circuit 410 of the DELETE row, the $\overline{\text{DELETE}}$ signal stops or breaks the propagation at the NAND gate 412. Due to the propagation of the logic '1' along the ripple cascade, all of the row control outputs $R_n$ between the INSERT row 302 and the DELETE row 302 are set to logic '1'. Other row control outputs $R_n$ outside of the subset of rows delineated by the INSERT row 302 and DELETE row 302 remain at logic '0'.

Figure 7:
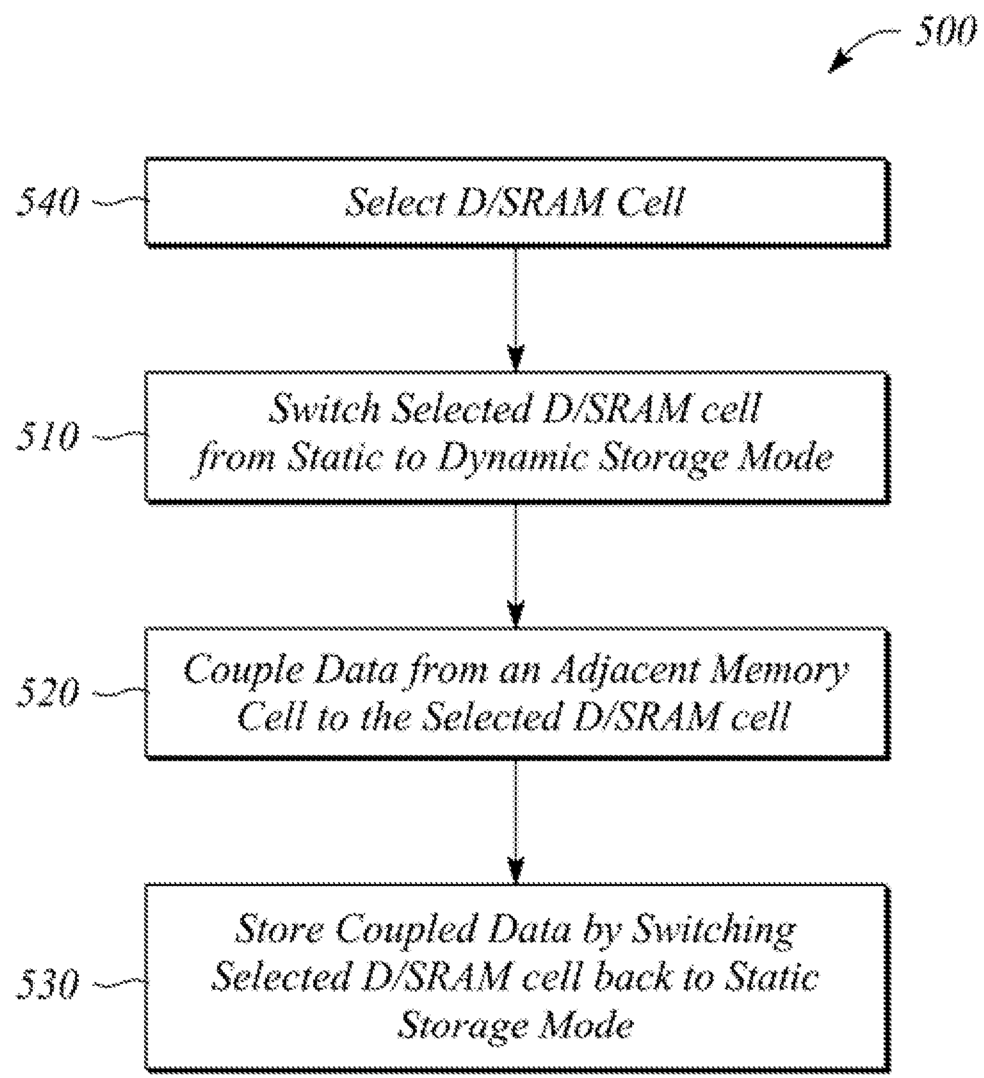
FIG. 7 illustrates a flow chart of method of shifting data using a block shift static random access memory (BS-SRAM), according to an example in accordance with the principles described herein.

FIG. 7 illustrates a flow chart of a method 500 of shifting data using a block shift static random access memory (BS-SRAM), according to an example consistent with the principles described herein. As illustrated, the method 500 of shifting data comprises switching 510 a selected D/SRAM cell in a row of the BS-SRAM from a static storage mode to a dynamic storage mode. The D/SRAM cell may be substantially similar to the D/SRAM cell 100 described above, according to some examples.

According to various examples, switching 510 the D/SRAM cell may be provided by decoupling cross-coupled elements of the D/SRAM cell. For example, decoupling may be provided by opening one or more switches located in a cross-coupling connection between the cross-coupled elements. Opening the switches breaks the connection and isolates the cross-coupled elements from one another to produce the dynamic storage mode. In some examples, the switches may be opened in a substantially simultaneous manner.

The switches may be provided by a dynamic/static (D/S) mode selector, for example. According to some examples, the D/S mode selector may be substantially similar to the D/S mode selector 120 described above with respect to the D/SRAM cell 100. In some examples, the cross coupled elements may be substantially similar to the pair of cross-coupled elements 112, 114 described above with respect to the D/SRAM cell 100. For example, the cross-coupled elements may comprise a pair of inverters and the D/S mode selector may comprise a pair of transistor switches.

The method 500 of shifting data further comprises coupling 520 data from an adjacent memory cell to the selected D/SRAM cell. According to various examples, the adjacent memory cell may be in another row of the BS-SRAM from the row of the selected D/SRAM cell. In some examples, the selected D/SRAM cell is in a column of the BS-SRAM. The adjacent memory cell may be another D/SRAM cell in the same column, for example. Coupling 520 the data from the adjacent memory cell into the selected D/SRAM cell is configured to load the data in the selected D/SRAM cell. In particular, the data is loaded into a master element of the cross-coupled elements of the selected D/SRAM cell.

In some examples, coupling 520 the data from the adjacent memory cell comprises employing a load/shift (L/S) coupler. The L/S coupler may connect an input of the selected D/SRAM cell to an output of the adjacent memory cell, for example. The coupled data may be transmitted through the L/S coupler, for example. In some examples, the L/S coupler may be substantially similar to the L/S coupler 130 described above with respect to the D/SRAM cell 100. In particular, the L/S coupler may comprise a switch (e.g., a transistor switch) that, when activated, facilitates transmission of the data through the L/S coupler, for example.

The method 500 of shifting data further comprises storing 530 the coupled and loaded data by switching the selected d/SRAM cell back to the static storage mode. The selected D/SRAM cell may be switched back to the static storage mode by the D/S mode selector, for example. In some examples, a first switch (e.g., of the D/S mode selector) is closed first; i.e., the switch connected between an output of the coupled element receiving the coupled data from the adjacent memory cell and an input of the other coupled element. After the first switch is closed, a second switch connected between an output of the other coupled element and the receiving coupled element is closed. Sequentially closing the first switch and then the second switch may avoid development of a race condition in the cross-coupled elements once coupling is re-established by closing the switches, for example.

In some examples, the method 500 of shifting data further comprises selecting 540 the D/SRAM cell. In some examples, selecting 540 the D/SRAM cell comprises providing an INSERT row address and a DELETE row address. In these examples, switching 510 the selected D/SRAM cell(s), coupling 520 the data from an adjacent memory cell, and storing 530 the coupled data are performed on each of a plurality of D/SRAM cells in the selected rows between the INSERT row address and the DELETE row address. Selecting 540 the D/SRAM cell, switching 510 the selected D/SRAM cell(s), coupling 520 the data, and storing 530 the coupled data result in a block shift of the data stored in the BS-SRAM rows between the INSERT row address and the DELETE row address, according to several examples.

Thus, there have been described examples of a dynamic/static random access memory (D/SRAM) cell, a block shift static random access memory (BS-SRAM), and method of shifting data using the BS-SRAM employing switching between a dynamic storage mode and a static storage mode to shift data. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A dynamic/static random access memory (D/SRAM) cell comprising:

a static random access memory (SRAM) cell having a pair of cross-coupled elements to store data; and a dynamic/static (D/S) mode selector to selectably switch the D/SRAM cell between a dynamic storage mode and a static storage mode, the D/S mode selector comprising a switch to selectably couple and decouple the pair of cross-coupled elements of the SRAM cell, wherein the dynamic storage mode corresponds to decoupled cross-coupled elements and the static storage mode corresponds to coupled cross-coupled elements;

a load/store (L/S) coupler to selectably couple data from an adjacent memory cell into the D/SRAM cell, wherein the D/SRAM cell is put into the dynamic storage mode and selectably coupled to the adjacent memory cell by activating the load/store coupler;

wherein after activating the load/store coupler, the data is transferred from the adjacent memory cell into one of the cross-coupled elements of the memory cell, and the load/store coupler is deactivated and the memory cell is put into the static memory mode to retain the loaded data.

2. The D/SRAM cell of claim 1, wherein the cross-coupled elements comprise a first inverter cross-coupled to a second inverter, and wherein the switch comprises a first transistor switch connected between an output of the first inverter and an input of the second inverter and a second transistor switch connected between an output of the second inverter and an input of the first inverter, and wherein the dynamic storage mode is provided by an OFF condition of both of the first transistor switch and the second transistor switch to decouple the cross-coupled first and second inverters.

3. The D/SRAM cell of claim 1, wherein the SRAM cell is a six transistor (6T) SRAM cell.

4. The D/SRAM cell of claim 1, wherein the L/S coupler comprises:

a first switch connected between a first load/store input of the D/SRAM cell and a first cross-couple element of the SRAM cell to selectably couple data from a first adjacent memory cell; and a second switch connected between a second load/store input of the D/SRAM cell and a second cross-coupled element of the SRAM cell to selectably couple data from a second adjacent memory cell.

5. The D/SRAM cell of claim 1, wherein the D/SRAM cell is a member of a first row of memory cells and the adjacent memory cell is a D/SRAM cell in a second row of memory cells.

6. A block shift static random access memory (BS-SRAM) comprising the D/SRAM cell of claim 1 arranged in a column that includes a plurality of other memory cells, the BS-SRAM further comprising a controller to shift data from the adjacent memory cell in the column to the D/SRAM cell by selective activation of the L/S coupler and the D/S mode selector, wherein the selective activation to provide a downshift of the data when the adjacent memory cell is in the column at a location above the D/SRAM cell and to provide an upshift of the data when the adjacent memory cell is in the column at a location below the D/SRAM cell.

7. A block shift static random access memory (BS-SRAM) comprising:

a plurality of dynamic/static random access memory (D/SRAM) cells arranged in an array having rows and columns, each of the D/SRAM cells comprising a dynamic/static (D/S) mode selector and a load/store (L/S) coupler; and a controller to shift data from an adjacent D/SRAM cell in a second row of the array to a D/SRAM cell in a first row by selective activation of the L/S coupler and the D/S mode selector of the first row D/SRAM cell, wherein the D/S mode selector comprises a decoupling switch between cross-coupled elements of the D/SRAM cell to provide switching between a dynamic storage mode and a static storage mode, of the D/SRAM cell using selectable decoupling of the cross-coupled elements;

an augmented decoder to provide a plurality of row control signals to select a subset of rows and a clock signal generator to provide a plurality of clock signals to the selected subset of rows, the plurality of clock signals to:

activate the D/S mode selector of the D/SRAM cells in the selected subset of rows to switch the D/SRAM cells from static storage mode to the dynamic storage mode;

selectively activate the L/S coupler of the D/SRAM cells in the selected subset of rows, which are in the dynamic storage mode, to load data into the D/SRAM cells of a row from the adjacent D/SRAM cells in another row; and deactivate the L/S coupler and D/S mode selector of the D/SRAM cells to store the loaded data by returning the D/SRAM cells to static storage mode.

8. The BS-SRAM of claim 7, wherein both of the D/SRAM cell in the first row and the adjacent D/SRAM cell in the second row are in a common column of the array along with another adjacent D/SRAM cell in a third row, the second row being above the first row and the third row being below the first row, and wherein the L/S coupler of the first row D/SRAM cell comprises:

a first switch connected to an output of the adjacent D/SRAM cell in the second row, the first switch to downshift data in the column from the adjacent second row D/SRAM cell to the first row D/SRAM cell; and a second switch connected to an output of the other adjacent D/SRAM cell in the third row, the second switch to upshift data in the column from the adjacent third row D/SRAM cell to the first row D/SRAM cell.

9. The BS-SRAM of claim 7, wherein the D/SRAM cells further comprise a six transistor (6T) SRAM cell, the cross-coupled elements comprising a pair of cross-coupled inverters implemented by four transistors of the 6T SRAM cell, and wherein the D/S mode selector comprises a pair of transistors in cross-coupling connections between the pair of cross-coupled inverters, the decoupling switch to use the pair of transistors to selectably disconnect and selectably connect the cross-coupling connections.

10. The BS-SRAM of claim 7, wherein the controller is configured to select the subset of rows in the array between an INSERT row and a DELETE row, the controller being further configured to shift data between D/SRAM cells only within the selected subset of rows, the shifted data of the selected subset of rows representing a contiguous subset of the data stored in the BS-SRAM, wherein the contiguous subset of the data has a size that is smaller than a total storage size of the BS-SRAM, and wherein the controller only shifts data stored inside the contiguous subset when the contiguous subset is shifted.

11. A method of shifting data using a block shift static random access memory (BS-SRAM), the method comprising:

switching a selected dynamic/static random access memory (D/SRAM) cell in a row of the BS-SRAM from a static storage mode to a dynamic storage mode by decoupling cross-coupled elements of the D/SRAM cell;

in response to switching the selected D/SRAM cell to the dynamic storage mode, coupling data from an adjacent memory cell in another row of the BS-SRAM into the selected D/SRAM cell to load the data;

and in response to the data being loaded in the selected D/SRAM cell, storing the coupled data by switching the selected D/SRAM cell back to the static storage mode.

12. A method of shifting data of claim 11, wherein switching the selected D/SRAM cell comprises opening switches of a dynamic/static (D/S) mode selector in a cross-coupling connection between the cross-coupled elements to decouple the cross-coupled elements, and wherein coupling data comprises employing a load/shift (L/S) coupler to connect an input of the selected D/SRAM cell to an output of the adjacent memory cell, the coupled data being transmitted through the L/S coupler.

13. The method of shifting data of claim 11, further comprising selecting the D/SRAM cell in the row, wherein selecting the D/SRAM cell comprises:

providing an INSERT row address a DELETE row address; and selecting one or more rows of the BS-SRAM having a plurality of D/SRAM cells, the selected one or more rows being between the INSERT row address and the DELETE row address, wherein coupling data and storing the coupled data being performed on the plurality of D/SRAM cells in the selected rows, wherein selecting the D/SRAM cell, coupling data and storing the coupled data results in a block shift of the data stored in the BS-SRAM rows between the INSERT row address and the DELETE row address.

* * * * *